US010382032B2

(12) United States Patent
Mukhopadhyay et al.

(10) Patent No.: US 10,382,032 B2
(45) Date of Patent: Aug. 13, 2019

(54) LOW ELECTROMAGNETIC INTERFERENCE AND SWITCH LOSS MOTOR DRIVER

(71) Applicant: TEXAS INSTRUMENTS INCORPORATED, Dallas, TX (US)

(72) Inventors: Rajarshi Mukhopadhyay, Allen, TX (US); Sooping Saw, McKinney, TX (US); Anuj Jain, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 15 days.

(21) Appl. No.: 15/714,643

(22) Filed: Sep. 25, 2017

(65) Prior Publication Data

US 2018/0269869 A1 Sep. 20, 2018

Related U.S. Application Data

(60) Provisional application No. 62/473,657, filed on Mar. 20, 2017.

(51) Int. Cl.

| | |
|---|---|
| ***H02P 6/14*** | (2016.01) |
| ***H03K 17/16*** | (2006.01) |
| ***H02M 1/08*** | (2006.01) |
| ***H02M 1/44*** | (2007.01) |
| *H02P 6/08* | (2016.01) |
| *H02M 7/5387* | (2007.01) |
| *H02M 1/00* | (2006.01) |

(52) U.S. Cl.

CPC ............ *H03K 17/162* (2013.01); *H02M 1/08* (2013.01); *H02M 1/44* (2013.01); *H02P 6/14* (2013.01); *H03K 17/166* (2013.01); *H02M 7/5387* (2013.01); *H02M 2001/0029* (2013.01); *H02M 2001/0054* (2013.01); *H02P 6/085* (2013.01); *H03K 2217/0045* (2013.01); *H03K 2217/0063* (2013.01); *H03K 2217/0072* (2013.01)

(58) Field of Classification Search

CPC ... H02P 6/185; H02P 6/22; H02P 6/28; G05B 2219/41326; G05B 2219/42198

See application file for complete search history.

(56) References Cited

U.S. PATENT DOCUMENTS

| | | | | |
|---|---|---|---|---|
| 6,208,107 | B1 * | 3/2001 | Maske .............. | A61M 5/14224 318/685 |
| 7,012,391 | B2 * | 3/2006 | DuLaney ............... | G11B 19/20 318/400.03 |

(Continued)

*Primary Examiner* — Rina I Duda

(74) *Attorney, Agent, or Firm* — Brian D. Graham; Charles A. Brill; Frank D. Cimino

(57) ABSTRACT

Modulating a gate drive current supplied to an output drive switch coupled to an electric motor by performing at least the following: obtain a gate drive current modulation profile, supply, based on the gate drive current modulation profile, a first gate drive current level as the gate drive current when the output drive switch is operating within a first region, drop the first gate drive current level to a second gate drive current level when the output drive switch transitions from the first region to operating within a Miller region, increase the second gate drive current level to a third gate drive current level within the Miller region, and set the gate drive current to a fourth gate drive current level when the output drive switch transitions from the Miller region to operating within a third region.

20 Claims, 6 Drawing Sheets

(56) References Cited

U.S. PATENT DOCUMENTS

2011/0175650 A1* 7/2011 Tumminaro ..... H03K 17/04123
327/109
2015/0236686 A1* 8/2015 Senda ................ H03K 17/0828
327/381

* cited by examiner

LOW ELECTROMAGNETIC INTERFERENCE AND SWITCH LOSS MOTOR DRIVER

CROSS-REFERENCE TO RELATED APPLICATIONS

This application claims the benefit of U.S. Provisional Patent Application No. 62/473,657, filed Mar. 20, 2017 by Rajarshi Mukhopadhyay et al. and entitled "Low-EMI Motor Driver," which is hereby incorporated by reference as if reproduced in its entirety.

BACKGROUND

A variety of industries have been trending towards manufacturing equipment and other machinery that utilize as their energy source electric power rather than hydrocarbon fuels (e.g., gasoline and diesel). In particular, automakers continue to design and manufacture electric-powered vehicles that include electric motors. Examples of electric motors that automakers generally utilize include brushless direct current (BLDC) motors, brushed direct current (DC) motors, and alternating current (AC) induction motors. As an example, BLDC motors receive electric power through an inverter that generates an AC electric current to power multiple electromagnets, such as permanent magnets. The BLDC motor subsequently converts the received electric power to mechanical power by rotating a motor shaft. Often times, the electric motors within the electric-powered vehicles operate at relatively high current and power levels, which cause a variety of design and reliability concerns.

Electric-powered machinery typically include motor drive systems that monitor and control the electric motors. To maximize performance while minimizing reliability concerns and production cost, manufacturers generally aim to design a motor drive system that generates relatively low switch loss and electromagnetic interference (EMI). Unfortunately, a motor drive system that implements a relatively fast voltage change rate often produces a higher amount of EMI that affects cables and communication lines connected to the electric motors. Conversely, implementing a relatively slow voltage change rate reduces EMI, but causes higher switching loss and power dissipation. Higher switching loss and power dissipation typically cause reliability issues and limit the amount of current the motor driver is able to provide to electric motors. As such, producing a motor drive system that is able to minimize reliability concerns (e.g., EMI and temperature), package sizes (e.g., integrated circuit and heat sink sizes), and manufacturing costs while improving performance remains valuable for machinery with electric motors.

SUMMARY

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

In one embodiment, a system comprising: a non-transitory memory and one or more hardware processors configured to read instructions from the non-transitory memory to cause the system to: obtain a gate drive current modulation profile for supplying a gate drive current of an output drive switch configured to be coupled to an electric motor, supply, based on the gate drive current modulation profile, a first gate drive current level as the gate drive current when the output drive switch is operating within a first region, decrease, based on the gate drive current modulation profile, the first gate drive current level to a second gate drive current level when the output drive switch transitions from the first region to operating within a Miller region, increase, based on the gate drive current modulation profile, the second gate drive current level to a third gate drive current level within the Miller region, and set, based on the gate drive current modulation profile, the gate drive current to a fourth gate drive current level when the output drive switch transitions from the Miller region to operating within a third region.

In another embodiment, a method comprising: supplying, based on a gate drive current modulation profile, a first gate drive current level as a gate drive current when an output drive switch is operating within a first region, decreasing, based on the gate drive current modulation profile, the first gate drive current level to a second gate drive current level when the output drive switch transitions from the first region to operating within a Miller region, increasing, based on the gate drive current modulation profile, the second gate drive current level to a third gate drive current level within the Miller region, and setting, based on the gate drive current modulation profile, the gate drive current to a fourth gate drive current level when the output drive switch transitions from the Miller region to operating within a third region.

In yet another embodiment, a motor driver comprising: a current control circuit configured to supply a gate drive current for an output drive switch coupled to an electric motor and a hardware control logic coupled to the current control circuit, wherein the hardware control logic is configured to: determine a first gate drive current level as the gate drive current based on a determination that the output drive switch is operating within a first region, determine a second gate drive current level as the gate drive current that is less than the first gate drive current level based on a determination that the output drive switch transitions from the first region to operating within a Miller region, determine a third gate drive current level as the gate drive current that is greater than the second gate drive current level based on a determination that the output drive switch is operating within the Miller region, determine a fourth gate drive current level for the gate drive current based on a determination that the output drive switch transitions from the Miller region to operating within a third region, and transmit one or more instructions to the current control circuit that include the first gate drive current level, the second gate drive current level, the third gate drive current level, and the fourth gate drive current level.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

Figure 1:
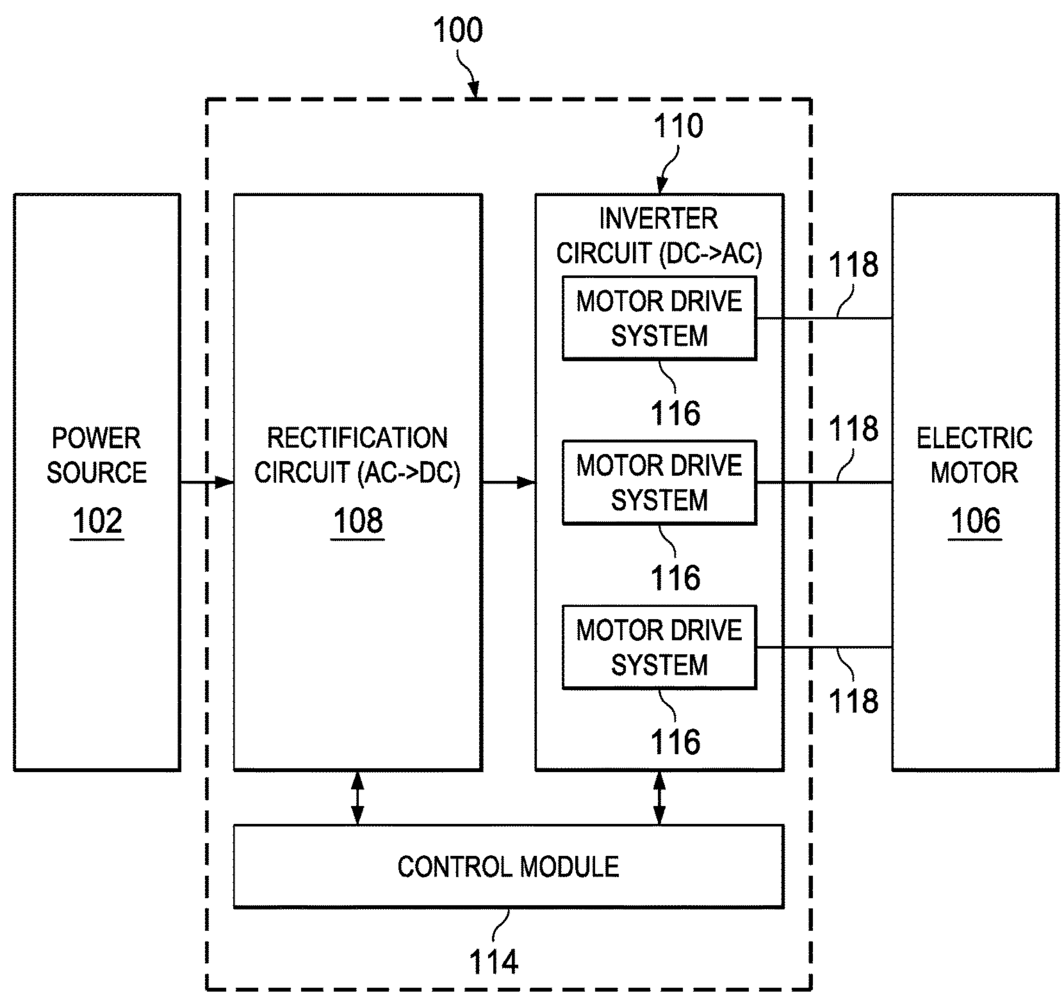
FIG. 1 is a schematic diagram of a motor control system in accordance with various embodiments.

While certain embodiments will be described in connection with the illustrative embodiments shown herein, the invention is not limited to those embodiments. On the contrary, all alternatives, modifications, and equivalents are included within the spirit and scope of the invention as defined by the claims. In the drawing figures, which are not to scale, the same reference numerals are used throughout the description and in the drawing figures for components and elements having the same structure, and primed reference numerals are used for components and elements having a similar function and construction to those components and elements having the same unprimed reference numerals.

DETAILED DESCRIPTION

In the following description, for purposes of explanation, numerous specific details are set forth in order to provide a thorough understanding of the invention. It will be apparent, however, to one skilled in the art that the invention may be practiced without these specific details. In other instances, structure and devices are shown in block diagram form in order to avoid obscuring the invention. References to numbers without subscripts or suffixes are understood to reference all instance of subscripts and suffixes corresponding to the referenced number. Moreover, the language used in this disclosure has been principally selected for readability and instructional purposes, and may not have been selected to delineate or circumscribe the inventive subject matter, resort to the claims being necessary to determine such inventive subject matter. Reference in the specification to "one embodiment" or to "an embodiment" means that a particular feature, structure, or characteristic described in connection with the embodiments is included in at least one embodiment of the invention, and multiple references to "one embodiment" or "an embodiment" should not be understood as necessarily all referring to the same embodiment.

The terms "a," "an," and "the" are not intended to refer to a singular entity unless explicitly so defined, but include the general class of which a specific example may be used for illustration. The use of the terms "a" or "an" may therefore mean any number that is at least one, including "one," "one or more," "at least one," and "one or more than one." The term "or" means any of the alternatives and any combination of the alternatives, including all of the alternatives, unless the alternatives are explicitly indicated as mutually exclusive. The phrase "at least one of" when combined with a list of items, means a single item from the list or any combination of items in the list. The phrase does not require all of the listed items unless explicitly so defined.

Various example embodiments are disclosed herein that reduces reliability concerns, while improving operating efficiency for motor drivers. A motor driver is part of a motor drive system that produces one or more output waveforms to control and regulate one or more electric motors. In one embodiment, to reduce EMI while maintaining a relatively fast voltage rate of change, a motor driver performs closed-loop monitoring and control of a peak voltage rate of change and EMI for both the turn-ON and turn-OFF responses one or more output drive switches. The motor driver modulates the gate drive current supplied to the output drive switches to smooth out the corners of the output waveforms and provide a relatively fast voltage rate of change when transitioning the output waveform from high to low or low to high. The smoothing out of the corners reduces EMI, such as voltage ringing, standing waves, and/or overvoltage, while maintaining a relatively fast voltage rate of change to reduce switching loss. The motor driver also performs closed-loop monitoring and control of the peak voltage rate of change and EMI to adjust the modulation of the gate drive current supplied to the output drive switch. For purposes of this disclosure, the voltage rate of change is also referred to throughout this disclosure as "dV/dt" or the slew rate.

FIG. 1 is a schematic diagram of an embodiment of a motor control system 100 in which various embodiments are able to operate. As shown in FIG. 1, the motor control system 100 receives AC power from power source 102 and utilizes the electric power from the power source 102 to drive an electric motor 106. To drive and control the electric motor 106, the motor control system 100 includes a rectification circuit 108, an inverter circuit 110, and a control module 114. The rectification circuit 108 is configured to rectify AC to DC and the inverter circuit 110 converts DC to AC. In one embodiment, because the motor control system 100 is configured to operate at relatively high current and power levels, the rectification circuit 108 performs a three-phase rectification to generate the DC output. The DC output is then sent to the inverter circuit 110 to convert the DC output back to an AC output to be provided to the electric motor 106.

The inverter circuit 110 regulates the frequency at which the output waveform is switched on and off. For example, the inverter circuit 110 is a pulse-width modulation (PWM) inverter that supplies output voltages to a number of windings of the electric motor 106 via connections 118. The inverter circuit 110 communicates with the control module 114 in order to regulate and control the duty cycle and the frequency of the switched on and off states for the windings. In one or more embodiments, the control module 114 provides instructions to the inverter circuit 110 to generate output waveforms, where each winding could have the same frequency but are out of phase with each other. By doing so, the inverter circuit 110 is able to control and manage the operation of the electric motor 106. As a PWM inverter, the inverter circuit 110 could provide both frequency and voltage control by defining the pulse width, duty cycle, and frequency of the output waveform for each of the windings.

The control module 114 includes a microprocessor, one or more central processing unit (CPU) chips, and/or other types of computing components. For instance, the control module 114 is part of one or more application specific integrated circuits (ASICs), field programmable gate arrays (FPGA), and/or digital signal processors (DSPs). The control module 114 also includes one or more non-transitory memory modules, such as non-volatile or volatile memory storage mediums. For example, the memory device is random access memory (RAM), read only memory (ROM), flash memory, disk drives, tape drives, solid-state drives (SSDs) magnetic drives, and/or any other memory device used to store and execute instructions. In one or more embodiments, the memory module is used to house the instructions for carrying out various embodiments described herein, such as generating, updating, and/or providing an initial gate drive current modulation profile for one or more of the output drive switches within the motor drive system 116. As discussed in more detail below, modulating the gate drive current for the output drive switches within the motor drive system 116 reduces EMI while maintaining a relatively fast voltage rate of change for the output waveform.

FIG. 1 illustrates that the inverter circuit 110 includes a plurality of motor drive systems 116, where each motor drive system 116 generates an output waveform for one of the windings to the electric motor 106. Each motor drive system 116 is configured to smooth out sharp edges of the motor driver's output waveform while maintaining a relatively fast voltage rate of change. As part of the smoothing out process, the motor drive system 116 performs closed-loop monitoring and control of the peak voltage rate of change and EMI for both the turn-ON and turn-OFF responses of the output drive switches. The smoothing out of the corners reduces EMI, such as voltage ringing, standing waves, and/or overvoltage that occurs from implementing a relatively fast voltage rate of change. The relatively fast voltage rate of change generally results in a relatively low switching loss. Reducing and/or producing a relatively low switch loss allows manufacturers to utilize lower-cost smaller size integrated circuit (IC) packages and heat sinks and lower cost field-effect transistors (FETs). The motor drive system 116 is discussed in more detail in FIGS. 5 and 6.

Although FIG. 1 illustrates a specific embodiment of implementing a motor control system 100, the disclosure is not limited to the specific embodiment illustrated in FIG. 1. For instance, although FIG. 1 illustrates that the motor drive systems 116 are part of the inverter circuit 110, other embodiments of the motor control system 100 have the motor drive systems 116 as separate components from the inverter circuit 110. Alternatively, other embodiments of the motor control system 100 combines one or more of the system components into a single system component. Using FIG. 1 as an example, the inverter circuit 110, and/or control module 114 is implemented as a single system component. FIG. 1 also fails to depict other components known by persons of ordinary skill in the art typically found in a motor control system. The use and discussion of FIG. 1 is only an example to facilitate ease of description and explanation.

Figure 2:
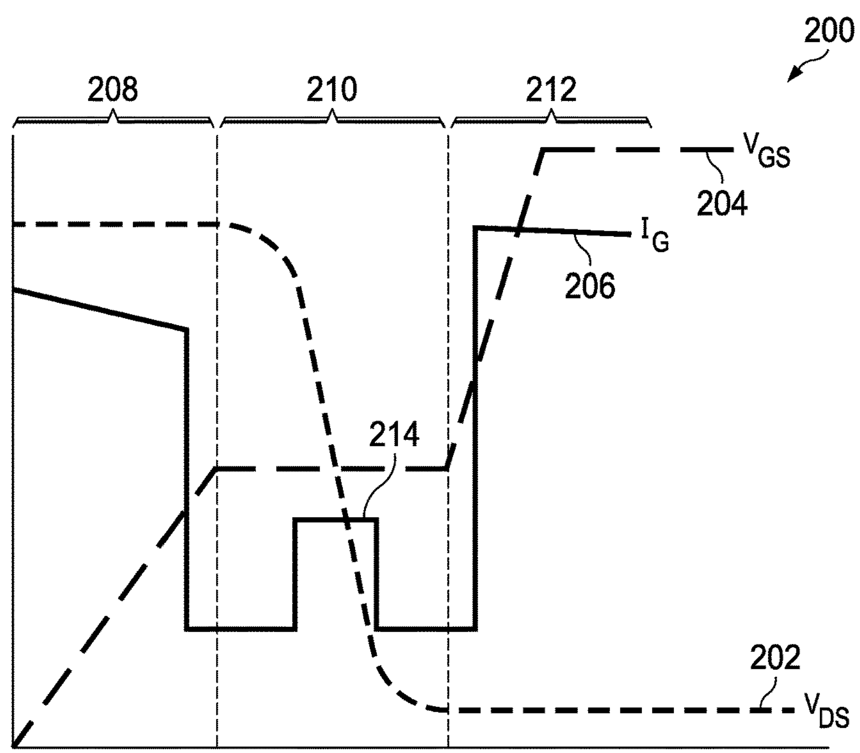
FIG. 2 illustrates a voltage-current graph that represents a turn-ON response for an output drive switch coupled to a motor driver
Figure 5:
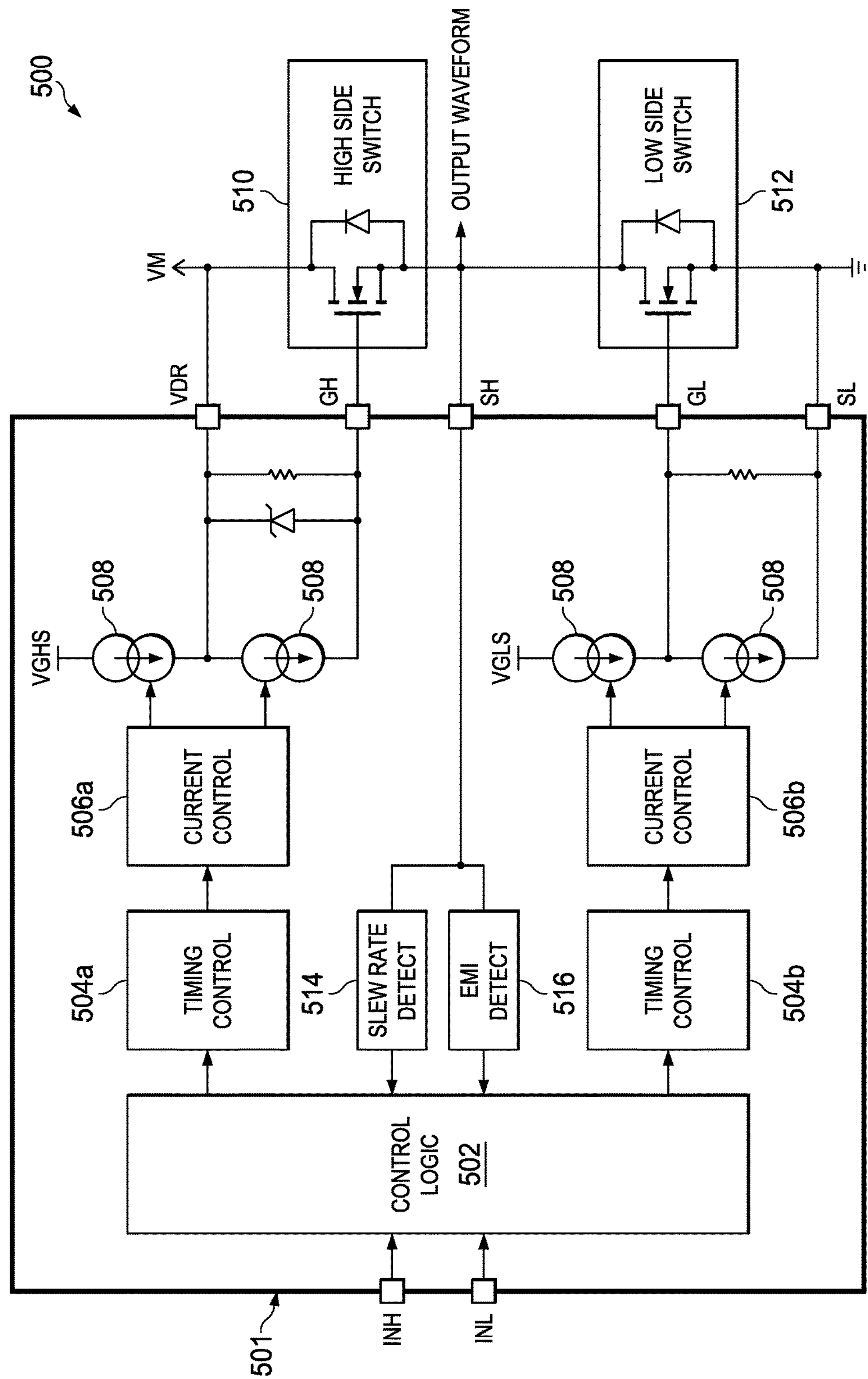
FIG. 5 is a schematic diagram of an embodiment of a motor drive system that includes a motor driver.
Figure 6:
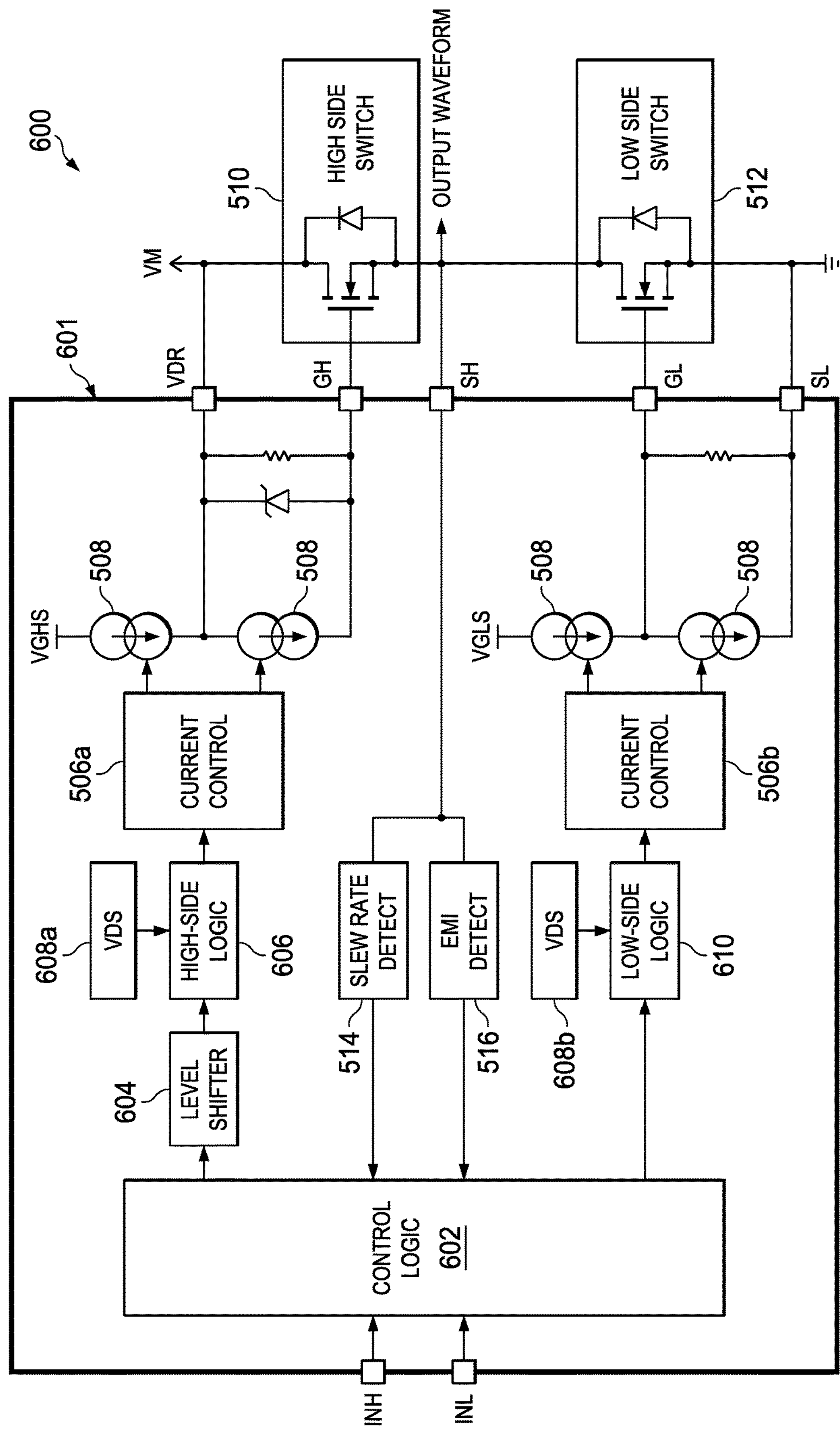
FIG. 6 is a schematic diagram of another embodiment of a motor drive system that includes a motor driver.

FIG. 2 illustrates a voltage-current graph 200 that represents a turn-ON response for an output drive switch located within a motor drive system, such as motor drive system 116 shown in FIG. 1. The output drive switches, which are shown in FIGS. 5 and 6 as output drive switches 510 and 512, correspond to the switches used to generate the output waveforms for a motor drive system. The motor drive system generates and transmits the output waveforms to regulate and control an electric motor and/or other components associated with the electric motor. The voltage-current graph 200 includes multiple voltage and current curves that relate to the operation of the output drive switch. Specifically, the voltage-current graph 200 depicts the relationship between the modulated gate drive current ($I_G$), gate drive voltage ($V_{GS}$), and drain to source voltage ($V_{DS}$) during operation of the output drive switch. FIG. 2 illustrates that motor drive system actively modulates $I_G$ supplied to the output drive switch to reduce EMI while maintaining a relatively fast voltage rate of change.

As shown in FIG. 2, the voltage-current graph 200 includes three different operation regions for the output drive switch, the cutoff region 208, the Miller region 210, and the saturation region 212. The output drive switch's transition between the operation regions is based on the supplied $V_{GS}$ in relation to a threshold voltage of the output drive switch. In FIG. 2, the output drive switch is initially in an OFF state at the start of the cutoff region 208. As the motor driver supplies more charge to the driver circuit, the $V_{GS}$ curve 204 shows that $V_{GS}$ begins to increase. When $V_{GS}$ reaches the drive switch's threshold voltage, current begins to flow through the drain to the source of the output drive switch. At this point, $V_{GS}$ remains fairly steady as the drive switch moves through the Miller region 210. After the Miller region 210, the $V_{GS}$ curve 204 transitions to the saturation region 212 as $V_{GS}$ continues to increase to a predetermined high voltage level.

The changes in $V_{GS}$ and transitioning through the different operation regions cause $V_{DS}$ of an output drive switch to change. The $V_{DS}$ curve 202 shown in FIG. 2 may correspond to the output waveform that a motor drive system supplies to an electric motor. As shown in FIG. 2, during the cutoff region 208, the $V_{DS}$ curve 202 is at a relatively high voltage level. During the Miller region 210, $V_{DS}$ starts to drop until after the Miller region 210, $V_{DS}$ reaches a designated low voltage level, for example, about 0V. The drive switch's voltage rate of change, corresponds to the change in voltage of $V_{DS}$ during the Miller region 210. As previously discussed, implementing a relatively fast voltage rate of change for the drive switch generate relatively high amounts of EMI for the $V_{DS}$ curve 202 and implementing a relatively slow voltage rage of change create efficiency and thermal issues.

To minimize EMI and maintain a relatively fast voltage rate of change, FIG. 2 illustrates that the motor driver actively modulates $I_G$ supplied to the output drive switch according to the $I_G$ curve 206. The $I_G$ curve 206, which can also be referred to as an $I_G$ modulation profile within this disclosure, demonstrates that $I_G$ is at a relatively high current level during the cutoff region 208. As the drive switch transitions from the cutoff region 208 to the Miller region 210, the $I_G$ curve 206 depicts that $I_G$ drops to a relatively low current level. The drop in $I_G$ smoothens out the upper corner of the $V_{DS}$ curve 202 by eliminating sources of EMI, such as voltage ringing and/or standing waves. During the Miller region 210, rather than maintaining a steady $I_G$, the $I_G$ curve 206 illustrates an incremental step 214 that increases $I_G$ to an intermediate current level from the relatively low current level. The incremental step 218 within the Miller region 210 allows the switching device to maintain a relatively faster voltage rate of change. Without the incremental step 214, the voltage rate of change is relatively slower since the magnitude of $I_G$ supplied to the output drive switch would be relatively lower than that shown at incremental step 214. When transitioning from the Miller region 210 to the saturation region 212, the $I_G$ curve 206 shows that $I_G$ increases and returns to a relatively high current level. The increase in $I_G$ at this point also smoothens out the lower corner of the $V_{DS}$ curve 202. Performing the $I_G$ transition from the relatively low current level to a relatively high current level eliminates sources of EMI by smoothing out the lower corner of the $V_{DS}$ curve 202.

Figure 3:
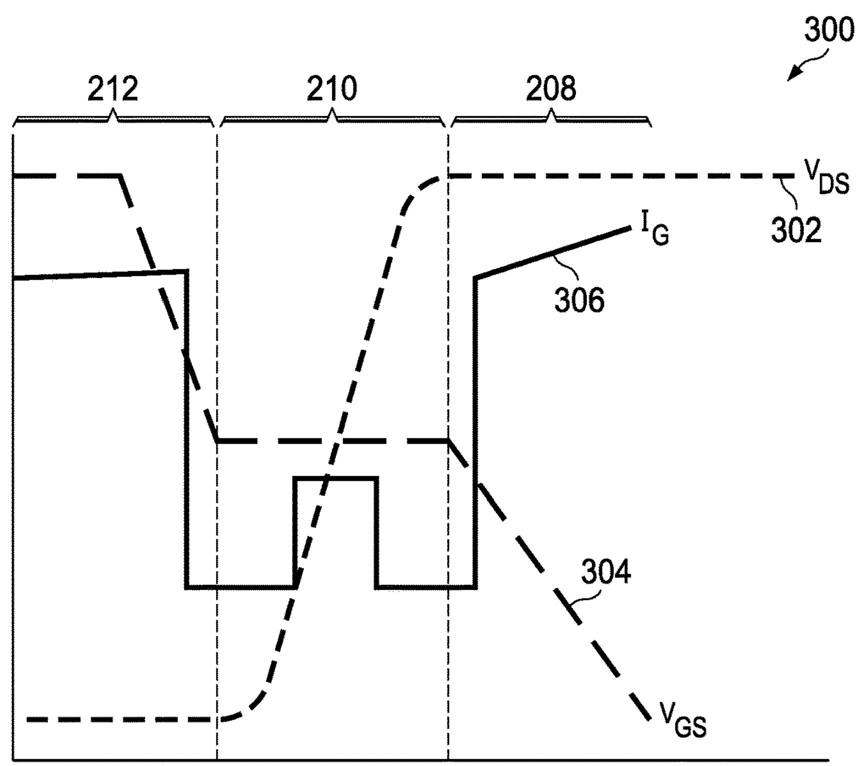
FIG. 3 illustrates a voltage-current graph that represents a turn-OFF response for an output drive switch coupled to a motor driver.

FIG. 3 illustrates a voltage-current graph 300 that represents a turn-OFF response for an output drive switch coupled to a motor driver. The voltage-current graph 300 includes $V_{DS}$ curve 302, $V_{GS}$ curve 304, and $I_G$ curve 306. Recall that transitioning to a relatively low voltage level for $V_{GS}$ causes the output drive switch to turn OFF while transitioning to a relatively high voltage level for $V_{GS}$ causes the output switch to turn ON. In contrast to voltage-current graph 200, the voltage-current graph 300 has the $V_{GS}$ curve 304 start at a relatively high voltage level and end at a relatively low voltage level (e.g., about 0V). The $V_{DS}$ curve 302 starts at a relatively low voltage level and ends at a relatively high voltage level. Similar to the $I_G$ curve 206 shown in FIG. 2, the $I_G$ curve 306 minimizes EMI and maintains a relatively fast voltage rate of change by smoothing out the edges and varying $I_G$ during the Miller region 210.

Figure 4:
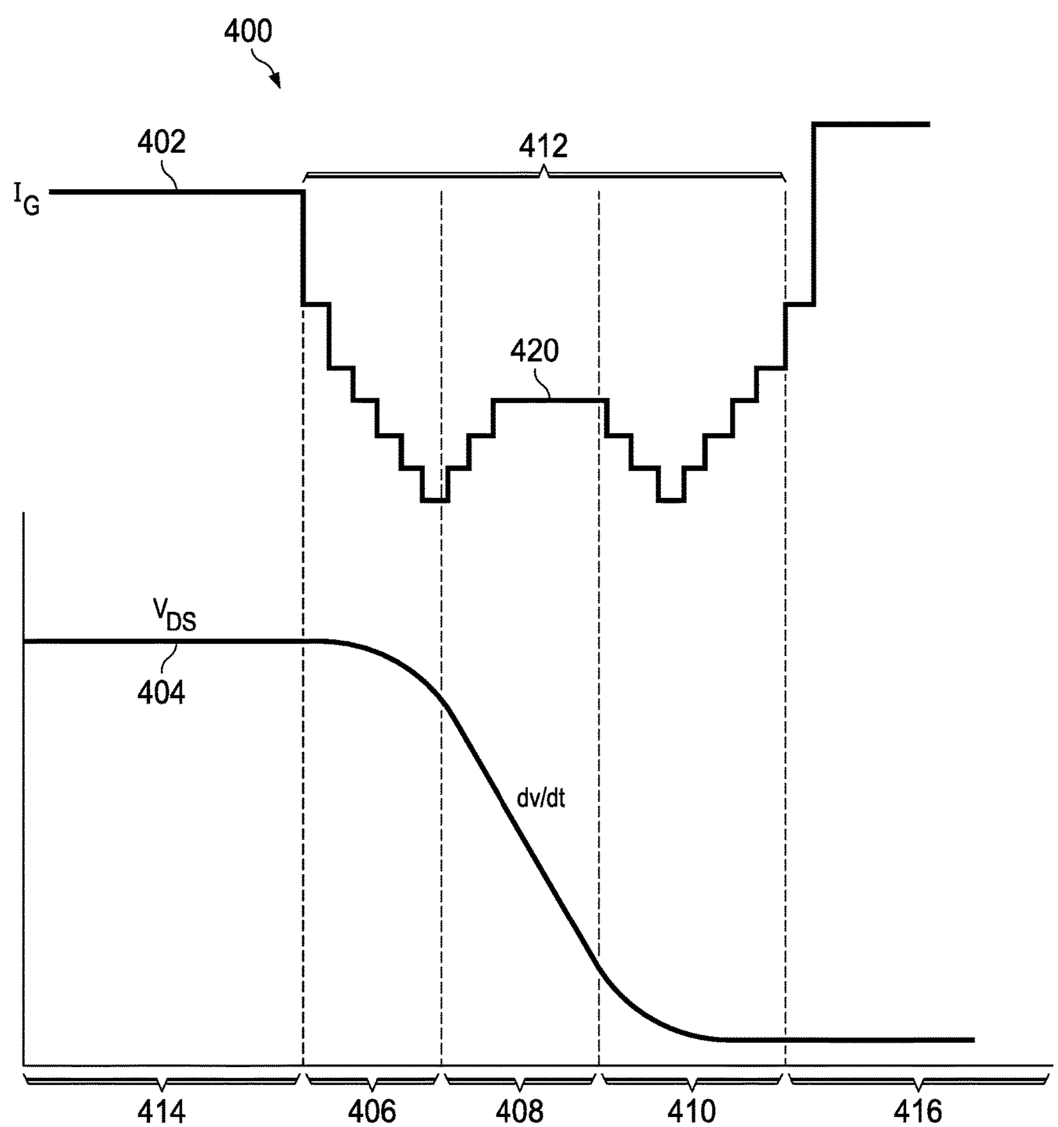
FIG. 4 illustrates another voltage-current graph that represents a turn-ON response for an output drive switch coupled to a motor driver.

FIG. 4 illustrates another voltage-current graph 400 that represents a turn-ON response for an output drive switch coupled to a motor driver. The voltage-current graph 400 includes an $I_G$ curve 402 and $V_{DS}$ curve 404. To smooth out the corners of the $V_{DS}$ curve 404 and provide a relatively fast voltage rate of change during slewing, the motor driver implements an $I_G$ modulation profile represented by $I_G$ curve 402 that includes current incremental steps at the different sub-regions of the Miller region 412. As shown in FIG. 4, the Miller region 412 includes the sub-region 406, the sub-region 408, and the sub-region 410. The sub-region 406 corresponds to a time period along the $V_{DS}$ curve 404 when $V_{DS}$ initially starts to decrease at a relatively slow voltage rate of change. The sub-region 408 corresponds to the point in time along the $V_{DS}$ curve 404 where the voltage rate of change $V_{DS}$ reaches a peak voltage rate of change, and sub-region 410 corresponds to the point in time along the $V_{DS}$ curve 404 that $V_{DS}$ returns to having a relatively slow voltage rate of change.

A motor driver is able to implement incremental steps to avoid abrupt transitions and improve the smoothing out of corners of the $V_{DS}$ curve 404. In FIG. 4, after the output drive switch transitions from the cutoff region 414 and enters the Miller region 412, $I_G$ initially drops to multiple lower current levels using incrementally downward steps within sub-region 406 of the Miller region 412. At sub-region 408 of the Miller region 412, the $I_G$ curve 402 includes incremental steps that increase $I_G$ to an intermediate current level 420 to maintain a relatively high peak voltage rate of change. The $I_G$ curve 402 maintains the intermediate current level 420 at a constant level for the rest of sub-region 408. Afterwards, in sub-region 410 of the Miller region 412, the motor driver modulates $I_G$ to incrementally step down and then incrementally step up to a relatively higher $I_G$ to reduce EMI. The incremental steps in sub-regions 406 and 410 smoothens out the corners of the $V_{DS}$ curve 404 and results in lower frequency content and EMI, such as voltage ringing and standing waves. The incremental steps in sub-region 408 improves and/or maintains a relatively high peak voltage rate of change.

FIG. 5 is a schematic diagram of an embodiment of a motor drive system 500, which corresponds to the motor drive system 116 shown in FIG. 1. FIG. 5 illustrates that the motor drive system 500 includes a motor driver 501 that is coupled to output drive switches 510 and 512. Output drive switch 510 represents a high side switch and the output drive switch 512 represents a low side switch. In a high side switch configuration, the load (e.g. an electric motor winding) is located between a reference ground. In a low side switch configuration, the load is located between a power rail and the output drive switch 512. The motor drive system 500 uses the high side switch and a low side switch to drive and/or regulate one or more electric motors. In one embodiment, the output drive switches 510 and 512 is part of an H-bridge configuration that includes other output drive switches not shown in FIG. 5. Implementing an H-bridge configuration allows voltages to be applied to a motor winding in either direction. Other embodiments have the output drive switches 510 and 512 be part of other types of circuit configurations known by persons of ordinary skill in the art to drive one or more electric motors.

The output drive switches 510 and 512 may be any type of electrical switch. In one or more embodiments, one or more of the output drive switches 510 and 512 are FETs. Using FIG. 5 as an example, both output drive switches 510 and 512 are enhanced n-channel metal-oxide semiconductor field-effect (NMOS) transistors. Alternatively, one or more of the output drive switches 510 and 512 could be other type of switches including other types of NMOS transistors, a p-channel metal-oxide semiconductor field-effect (PMOS) transistor, a p-type junction gate field-effect transistor (PJFET), a n-type junction gate field-effect transistor (NJFET), and a bipolar junction transistor (BJT), such as NPN and PNP transistors.

The motor driver 501 is configured to drive the output drive switches 510 and 512 to generate an output waveform supplied to the electric motor. To drive the output drive switches 510 and 512, the motor driver 501 includes a control logic 502, timing controls 504*a* and 504*b*, current control 506*a* and 506*b*, and adjustable current sources 508. For purposes of this disclosure, timing controls 504*a* and 504*b* can be collectively referred throughout this disclosure as timing control 504, and current controls 506*a* and 506*b* can be collectively referred throughout this disclosure as current controls 506. FIG. 5 also illustrates that the motor driver 501 implements a closed-loop monitoring and control of the peak voltage rate of change and EMI by including the slew rate detector 514 and the EMI detector 516.

The control logic 502 is configured to perform operations to receive, generate, process, and/or update an $I_G$ modulation profile. To perform these operations, the control logic 502 includes hardware and/or software (e.g., firmware) to carry out the $I_G$ modulation operations using computer instructions. For example, the control logic 502 includes non-transitory memory and/or one or more embedded controller, CPU, a semiconductor-based processors, a microcontroller, a FPGA, an ASIC, a DSP, analog hardware circuitry, and/or any other computing device suitable for processing and communicating computer instructions. Additionally or alternatively, the control logic 502 could include multiple cores on a chip and/or multiple core across multiple chips. In one or more embodiments, the motor driver 501 offloads one or more $I_G$ modulation operations to a separate control system, such as control module 114 shown in FIG. 1, based on performance, power consumption, and/or costs factors.

The control logic 502 receives, processes, and updates an $I_G$ modulation profile digitally or based on an analog implementation. In one embodiment, to update the $I_G$ modulation profile digitally, the control logic 502, includes one or more analog-to-digital (ADC) converters that convert received analog inputs to the digital domain. For instances, in FIG. 5, the control logic 502 receives the detected slew rate and the detected EMI as analog inputs from the slew rate detector 514 and EMI detector 516, respectively. Prior to utilizing and processing the analog inputs to update the $I_G$ modulation profile, one or more ADC converters process the analog inputs. Additionally or alternatively, the control logic 502 also receives the input high side (INH) and the input low side (INL) as analog inputs and subsequently use ADC converters to transform the analog inputs to a digital signals. In another embodiment, the control logic 502 updates the $I_G$ modulation profile using an analog implementation and includes one or more digital-to analog (DAC) converters. As an example, the INH and INL are digital inputs that the control logic 502 that convert to the analog domain prior to processing.

The control logic 502 uses one or more inputs to generate and/or update the $I_G$ modulation profiles, for example, $I_G$ curves 206 and 402 shown in FIGS. 2 and 4, respectively. FIG. 5 illustrates that the control logic 502 generates and/or updates one $I_G$ modulation profile for the output drive switch 510 and another $I_G$ modulation profile for the output drive switch 512. The control logic 502 receives and uses INH and INL to generate an initial $I_G$ modulation profile. For instance, the INH and INL corresponds to information regarding the target peak voltage rate of change, acceptable EMI, and one or more parameters to generate the initial $I_G$ modulation profile to apply to each of the output drive switches 510 and 512. Alternatively, INH and/or INL provides the initial $I_G$ modulation profile to the control logic 502 rather than having the control logic 502 generate the initial $I_G$ modulation profile. In other embodiments, the initial $I_G$ modulation profile is preconfigured and stored within the control logic 502, for example, as a default factory setting.

After generating the initial $I_G$ modulation profiles, the control logic 502 is able to update the initial $I_G$ modulation profile based on the input received from the slew rate detector 514. The slew rate detector 514 provides to the control logic 502 a measured peak voltage rate of change for the output waveform. The control logic 502 compares the measured peak voltage rate of change to the target peak voltage rate of change to determine whether the $I_G$ modulation profile needs to be updated. For example, if the measured peak voltage rate of change is less than the target peak voltage rate of change, the control logic 502 updates the $I_G$ modulation profile to increase the voltage rate of change and/or adjust the timing for transitioning between different regions and/or sub-regions. Using FIG. 2 as an example, the control logic 502 increases the magnitude of the incremental step 214 along the $I_G$ curve 206 to increase the voltage rate of change. For FIG. 4, the control logic 502 increases the current level for intermediate current level 420 for the $I_G$ curve 402. Additionally or alternative, the control logic 502 adjusts when the output drive switch transitions between the different sub-regions 406, 408, and 410.

The control logic 502 also updates the initial $I_G$ modulation profiles based on the input received from the EMI detector 516. The EMI detector 516 provides to the control logic 502 a measured EMI for the output waveform. The control logic 502 compares the measured EMI to the target EMI to determine whether the $I_G$ modulation profile needs to be updated. For example, if the measured EMI is greater than the target EMI, the control logic 502 updates the $I_G$ modulation profile to decrease EMI and/or adjust the timing for transitioning between different regions and/or sub-regions. Using FIG. 2 as an example, the control logic 502 decreases $I_G$ along the $I_G$ curve 206 to a relatively lower voltage level to decrease EMI when transitioning from the cutoff region 208 to the Miller region 210. For FIG. 4, the control logic 502 decreases $I_G$ along the $I_G$ curve 402 to a relatively lower voltage level in sub-regions 406 and 410 to further smooth out the corners of the output waveform. Additionally or alternative, the control logic 502 determines when the output drive switch transitions between the different sub-regions 406, 408, and 410.

Once the control logic 502 generates the initial and/or updated $I_G$ modulation profiles, the control logic 502 provides instructions and/or control signals to timing controls 504 to implement the $I_G$ modulation profiles. In particular to FIG. 5, timing control **504*a* controls the timing related to an $I_G$ modulation profile for the output drive switch 510, and timing control 504*b* controls the timing related to a separate $I_G$ modulation profile for the output drive switch 512. The timing controls 504 regulates the timing of when the output drive switches 510 and 512 transition to different operation regions and/or sub-regions according the received instructions and/or control signals from control logic 502. Using FIG. 4 as an example, the timing controls 504 regulates when the output drive switches 510 and 512 transition from different operation regions (e.g., from cutoff region 414 to the Miller region 412) and/or sub-regions (e.g., from sub-region 406 to sub-region 408). Additionally, the timing controls 504 is able to adjust the timing after receiving information from the control logic 502 regarding an updated $I_G$ modulation profile. The timing controls 504 produces output control signals that are subsequently sent to the current controls 506**.

FIG. 5 illustrates that the current controls 506 uses the control signals received from timing controls 504 to generate one or more quantized and/or discrete current steps using the adjustable current sources 508. The current control **506*a* controls the actual $I_G$ current supplied to the output drive switch 510, and current control 506*b* controls the actual $I_G$ current supplied to the output drive switch 512. Depending on the region and/or sub-region of operation indicated by the instructions and/or control signals from the timing controls 504 apply, the current controls 506 control and regulate the adjustable current sources 508 to incrementally increase and/or decrease the $I_G$ current supplied to output drive switches 510 and 512. Using FIG. 4 as an example, current control 506*a* controls the $I_G$ current to generate the $I_G$ curve 402 in the different operation regions 414, 416, and 418, and sub-regions 406, 408, and 410. In one or more embodiments, the adjustable current sources 508 acts as DAC that converts the digital signal received from the current control 506*a* to an analog output that adjusts the current supplied to the output drive switches 510 and 512**.

In FIG. 5, the slew rate detector 514 and EMI detector 516 perform closed loop monitoring of the output waveform sent to an electrical motor. The slew rate detector 514 determines the peak voltage rate of change, and the EMI detector 516 determines EMI experienced when the output drive switches 510 and 512 transition between different regions of operation. Both the slew rate detector 514 and EMI detector 516 may be implemented in a variety of methods known by persons of ordinary skills in the art. For example, a slew rate detector 514 includes a filtering component, such as a high pass filter (HPF), and a peak slew rate detector. The filtering component uses the HPF to separate out the main output waveform from EMI and produces a voltage pulse output to the peak slew rate detector. The peak slew rate detector then utilizes the voltage pulse output and generates a peak detector output that detects the peak amplitude of the voltage pulse output. The peak slew rate detector then transmits the peak detector output the control logic 502 to update the $I_G$ modulation profile.

FIG. 6 is a schematic diagram of another embodiment of a motor drive system 600, which corresponds to the motor drive system 116 shown in FIG. 1. FIG. 6 illustrates that the motor drive system 600 includes a motor driver 601 that is coupled to output drive switches 510 and 512. Similar to the motor driver 501, motor driver 601 includes a control logic 602 that perform operations to receive, generate, process, and/or update an $I_G$ modulation profile. In contrast to the control logic 502 in FIG. 5, the control logic 602 is configured to implement the timing control operations performed by timing controls 504.

FIG. 6 also depicts that the motor driver 601 includes other components related to the operation of the motor driver 601. In particular, the motor driver 601 includes a level shifter 604 that shifts or increases the output voltage level of the control logic 602 (e.g., 3.5 V) to a relatively high voltage level (e.g., above 60 V). $V_{DS}$ 608*a* and 608*b*, high-side logic 606, low-side logic 610 represents protection circuits that protect the motor driver 601 from over voltage situations. Specifically, $V_{DS}$ 608*a* and high-side logic 606 protect the high side portion of the motor driver 601, and $V_{DS}$ 608*b* and low-side logic 608 protects the low side portion of the motor driver 601. The additional components $V_{DS}$ 608*a* and 608*b*, high-side logic 606, low-side logic 610 can be implemented in a variety of methods known by persons of ordinary skill in the art. Additionally, motor driver 601 includes other components that are not shown in FIG. 6, but are known by persons of ordinary skill in the art typically found in a motor driver. The use and discussion of FIGS. 5 and 6 are only examples to facilitate ease of description and explanation.

Figure 7:
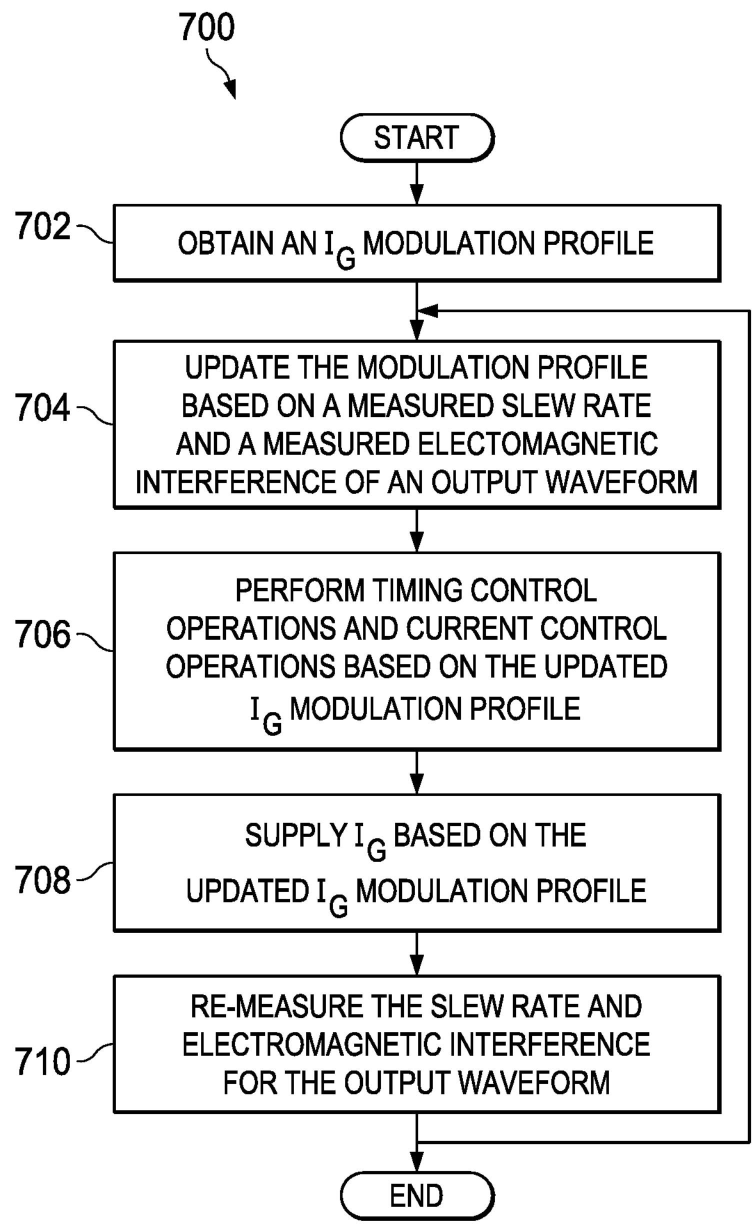
FIG. 7 is a flow chart of an embodiment of a method to modulate a gate drive current for an output drive switch.

FIG. 7 is a flow chart of an embodiment of a method 700 to modulate $I_G$ for an output drive switch. Method 700 modulates $I_G$ for an output drive switch using hardware, software (e.g., firmware), or both. Using FIGS. 5 and 6 as examples, method 700 can be implemented using motor drive systems 500 and 600, respectively. In one or more embodiments, method 700 is specifically implemented within the motor driver 501 and 601. Although FIG. 7 illustrates that the blocks of method 700 are implemented in a sequential operation, other embodiments of method 700 may have one or more blocks implemented in parallel operations.

Method 700 starts at block 702 and obtains an $I_G$ modulation profile. In one embodiment, method 700 obtains an $I_G$ modulation profile by generating the $I_G$ modulation profile based on received information, such as target peak voltage rate of change, acceptable EMI, and/or other parameters relating to $I_G$ modulation. In another embodiment, method 700 obtains an $I_G$ modulation profile from a separate device and/or based on preconfigured factory settings. Recall that the $I_G$ modulation profile varies the magnitude and/or timing of $I_G$ depending on the different operation regions and sub-regions for the output drive switch. Examples of portions of an $I_G$ modulation profile are shown as $I_G$ curve 206 and $I_G$ curve 306 and $I_G$ curve 402 in FIGS. 2-4, respectively.

Method 700 then moves to block 704 to update the $I_G$ modulation profile based on a measured slew rate and a measured EMI of an output waveform. In one embodiment, method 700 compares the measured peak slew rate to a target peak slew rate and adjusts the modulation of $I_G$ based on the comparison. Method 700 also compares the measured EMI to a target EMI and adjust the modulation of $I_G$ based on the comparison. Method 700 adjusts the values of $I_G$ and/or the timing of when the output drive switch transitions to different regions and/or sub-regions. Method 700 continues to block 706 and performs timing control and current control operations based on the updated $I_G$ modulation profile. The timing control operations sets when to adjust $I_G$ supplied to the output drive switch. The current control operations sets the current value of $I_G$ during the different regions and/or sub-regions of operations. In one embodiment, method 700 sets the current value of $I_G$ after implementing the timing control operations.

From block 706, method 700 proceeds to block 708 and supplies $I_G$ based on the updated $I_G$ modulation profile, which were previously discussed in more detail with reference to FIGS. 2-6. In other words, method 700 supplies $I_G$ to an output drive switch according to the timing control operations and/or current control operations as discussed above when describing FIGS. 2-6. Method 700 then continues to block 710 and re-measures the slew rate and EMI associated with the output waveform. Once method 700 completes block 710, method 700 returns back to block 704 to implement the closed-loop control and monitoring of the slew rate and EMI.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). The use of the term "about" means±10% of the subsequent number, unless otherwise stated.

Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise.

What is claimed is:

1. A system comprising:

a non-transitory memory; and one or more hardware processors configured to read instructions from the non-transitory memory to cause the system to:

obtain a gate drive current modulation profile for supplying a gate drive current of an output drive switch configured to be coupled to an electric motor;

supply, based on the gate drive current modulation profile, a first gate drive current level as the gate drive current when the output drive switch is operating within a first region;

decrease, based on the gate drive current modulation profile, the first gate drive current level to a second gate drive current level when the output drive switch transitions from the first region to operating within a Miller region;

increase, based on the gate drive current modulation profile, the second gate drive current level to a third gate drive current level within the Miller region; and set, based on the gate drive current modulation profile, the gate drive current to a fourth gate drive current level when the output drive switch transitions from the Miller region to operating within a third region.

2. The system of claim 1, wherein the fourth gate drive current level is greater than the third gate drive current level.

3. The system of claim 1, wherein the instructions further cause the system to decrease, based on the gate drive current modulation profile, the third gate drive current level to a fifth gate drive current level within the Miller region and prior to setting the gate drive current to the fourth gate drive current level.

4. The system of claim 1, wherein the instructions that cause the system to decrease the first gate drive current level to the second gate drive current level comprise instructions that cause the system to drop the first gate drive current level to the second gate drive current level with a plurality of incremental current steps.

5. The system of claim 1, wherein the instructions that cause the system to increase the second gate drive current level to the third gate drive current level comprise instructions that cause the system to increase the second gate drive current level to the third gate drive current level with a plurality of incremental current steps.

6. The system of claim 1, wherein the first region, the Miller region, and the third region correspond to when the output drive switch is transitioning to an ON state.

7. The system of claim 1, wherein the instructions further cause the system to receive a measured slew rate for the output drive switch and update the gate drive current modulation profile based on the measured slew rate.

8. The system of claim 7, wherein the instructions to update the gate drive current modulation profile comprise instructions that further cause the system to adjust the third gate drive current level within the gate drive current modulation profile based on the measured slew rate.

9. The system of claim 1, wherein the instructions further cause the system to receive a measured electromagnetic interference for the output drive switch and update the gate drive current modulation profile based on the measured electromagnetic interference.

10. The system of claim 9, wherein the instructions to update the gate drive current modulation profile comprise instructions that further cause the system to adjust the second gate drive current level within the gate drive current modulation profile based on the measured electromagnetic interference.

11. A method comprising:

supplying, based on a gate drive current modulation profile, a first gate drive current level as a gate drive current when an output drive switch is operating within a first region;

decreasing, based on the gate drive current modulation profile, the first gate drive current level to a second gate drive current level when the output drive switch transitions from the first region to operating within a Miller region;

increasing, based on the gate drive current modulation profile, the second gate drive current level to a third gate drive current level within the Miller region; and setting, based on the gate drive current modulation profile, the gate drive current to a fourth gate drive current level when the output drive switch transitions from the Miller region to operating within a third region.

12. The method of claim 11, wherein the fourth gate drive current level is greater than the third gate drive current level.

13. The method of claim 11, further comprising decreasing, based on the gate drive current modulation profile, the third gate drive current level to a fifth gate drive current level within the Miller region and prior to setting the gate drive current to the fourth gate drive current level.

14. The method of claim 11, further comprising receiving a measured slew rate for the output drive switch and updating the gate drive current modulation profile based on the measured slew rate.

15. The method of claim 11, further comprising receiving a measured electromagnetic interference for the output drive switch and updating the gate drive current modulation profile based on the measured electromagnetic interference.

16. The method of claim 11, wherein the first region, the Miller region, and the third region correspond to when the output drive switch is transitioning to an ON state.

17. The method of claim 11, wherein increasing the second gate drive current level to the third gate drive current level comprises increasing the second gate drive current level to the third gate drive current level with a plurality of incremental current steps.

18. A motor driver comprising:

a current control circuit configured to supply a gate drive current for an output drive switch coupled to an electric motor; and a hardware control logic coupled to the current control circuit, wherein the hardware control logic is configured to:

determine a first gate drive current level as the gate drive current based on a determination that the output drive switch is operating within a first region;

determine a second gate drive current level as the gate drive current that is less than the first gate drive current level based on a determination that the output drive switch transitions from the first region to operating within a Miller region;

determine a third gate drive current level as the gate drive current that is greater than the second gate drive current level based on a determination that the output drive switch is operating within the Miller region;

determine a fourth gate drive current level for the gate drive current based on a determination that the output drive switch transitions from the Miller region to operating within a third region; and transmit one or more instructions to the current control circuit that include the first gate drive current level, the second gate drive current level, the third gate drive current level, and the fourth gate drive current level.

19. The motor driver of claim 18, wherein the hardware control logic is further configured to determine a fifth gate current level is that is less than the third gate drive current level, and wherein the fifth gate current level corresponds to when the output drive switch is operating within the Miller region and prior to transitioning from the Miller region to operating within the third region.

20. The motor driver of claim 19, further comprising a slew rate detector coupled to the hardware control logic, and wherein the hardware control logic is further configured to receive a measured slew rate from the slew rate detector and update the third gate drive current level based on the measured slew rate.

* * * * *